United States Patent
Boglione

(10) Patent No.: US 11,747,384 B2
(45) Date of Patent: Sep. 5, 2023

(54) NOISE PARAMETER DETERMINATION OF SCALABLE DEVICES

(71) Applicant: The Government of the United States of America, as represented by the Secretary of the Navy, Arlington, VA (US)

(72) Inventor: Luciano Boglione, Washington, DC (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/179,143

(22) Filed: Feb. 18, 2021

(65) Prior Publication Data

US 2021/0263091 A1    Aug. 26, 2021

Related U.S. Application Data

(60) Provisional application No. 62/978,058, filed on Feb. 18, 2020.

(51) Int. Cl.
 *G01R 31/26* (2020.01)
 *G01R 29/26* (2006.01)

(52) U.S. Cl.
 CPC ......... *G01R 29/26* (2013.01); *G01R 31/2616* (2013.01); *G01R 31/2626* (2013.01)

(58) Field of Classification Search
 None
 See application file for complete search history.

(56) References Cited

U.S. PATENT DOCUMENTS

| | | | | |
|---|---|---|---|---|
| 3,652,931 A | * | 3/1972 | Josenhans | G01R 29/26 |
| | | | | 324/613 |
| 4,905,308 A | * | 2/1990 | Davidson | G01R 29/26 |
| | | | | 455/226.1 |
| 5,068,615 A | * | 11/1991 | Strid | G01R 29/26 |
| | | | | 324/613 |
| 5,170,126 A | * | 12/1992 | Wedge | G01R 29/26 |
| | | | | 324/762.08 |
| 5,191,294 A | * | 3/1993 | Grace | G01R 29/26 |
| | | | | 324/613 |
| 6,714,898 B1 | * | 3/2004 | Kapetanic | G01R 29/26 |
| | | | | 702/191 |
| 8,786,293 B1 | * | 7/2014 | Tsironis | G01R 31/2626 |
| | | | | 324/613 |
| 9,500,688 B2 | * | 11/2016 | Boglione | G01R 29/26 |

(Continued)

FOREIGN PATENT DOCUMENTS

CN    107076789 A  *  8/2017 ............. G01R 29/26

*Primary Examiner* — Jermele M Hollington
(74) *Attorney, Agent, or Firm* — US Naval Research Laboratory; William Ladd

(57) ABSTRACT

A method to determine noise parameters of a scalable device, is presented in which the determination of the noise parameters of the scalable device is independent of the model adopted for the device. The scalable device is connected as part of a test circuit including a noise source, a recirculator, a first power detector and a second power detector. The first power detector is connected to the recirculator and between the noise source and the scalable device and the second detector is connected to the device under test.

18 Claims, 5 Drawing Sheets

(56) References Cited

U.S. PATENT DOCUMENTS

| | | | |
|---|---|---|---|
| 11,119,140 B1* | 9/2021 | Tsironis | G01R 27/28 |
| 2016/0124032 A1* | 5/2016 | Simpson | G01R 29/26 |
| | | | 702/69 |
| 2022/0019915 A1* | 1/2022 | Bryan | G06F 8/20 |

* cited by examiner a.

b.

a.

b.

NOISE PARAMETER DETERMINATION OF SCALABLE DEVICES

RELATED APPLICATIONS

This application claims the benefit of U.S. Provisional Application No. 62/978,058 filed Feb. 18, 2020, which is hereby incorporated herein by reference.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing NC 110346-US2.

FIELD OF INVENTION

The present invention relates generally to noise measurement and estimation, and more particularly to determining noise in scalable devices.

BACKGROUND

The standard approach for the determination of the noise parameters of a microwave device relies on a well-known procedure, which requires an external tuner. The measurement technique is applicable to any two-port linear device and determines the whole set of four real-valued noise parameters at the frequency of interest. The determination of the noise parameters is particularly attractive when considering active devices used in the design of low-noise amplifiers and other microwave circuits. Indeed, the noise parameters of a linear active device are set over frequency once the designer selects its bias point. If the device is part of an integrated circuit, the designer has the additional degree of freedom of selecting the device size as well as emitter area in the bipolar transistor case and gate dimensions in the field-effect transistor (FET) case.

Device scalability is directly reflected by the proportional dependence of its admittance matrix Y on size, which we will refer to as W $$Y = y \cdot W. \quad (1)$$

From a noise perspective, the device equivalent current noise sources are proportional to $\sqrt{W}$ because the definition of noise current source in is based on the concept of available noise power at temperature T and the assumption that a conductance G is proportional to its size ($G = g \cdot W$). Hence $$i_n = \sqrt{4N_0 t g W} \quad (2)$$

where $t = T/T_0$ and $N_0 = kB T_0$ is the available noise power in a bandwidth B at the standard temperature $T_0 = 290K$ (k being Boltzmann's constant). Equation (2) shows that the noise current available to a matched termination varies as $\sqrt{W}$, whereas the available power to the same matched termination is constant and solely proportional to the temperature T: $P_{av} = N_0 t = kBT$. Consequently, the correlation matrix in admittance representation that describes the noise performance of a linear two-port network in terms of available powers will also be proportional to the device size as it is its admittance matrix $$C_n^Y = \sqrt{W i_n i_n^\dagger} \sqrt{W} = W \begin{bmatrix} c_{n_{11}}^Y & c_{n_{12}}^Y \\ (c_{n_{12}}^Y)^\dagger & c_{n_{22}}^Y \end{bmatrix}. \quad (3)$$

Recently, it has been demonstrated how to leverage the dependence of a device under test (DUT) on its size in order to: 1) determine its noise parameters and 2) remove the source tuner from the measurement setup. Removal of the tuner is key to drastically reduce the overall characterization time and extend the noise parameter measurement to the full extent of the measurement equipment capability.

The size-based approach is intuitively understandable after recasting the standard expression of noise figure or equivalent noise temperature $T_e$ and keeping in mind that the DUT's correlation matrix is a function of its size $$T_e(W) = \frac{\begin{bmatrix} Y_S^\dagger \\ 1 \end{bmatrix}^\dagger \cdot C_n^T(W) \cdot \begin{bmatrix} Y_S^\dagger \\ 1 \end{bmatrix}}{4 N_0 G_s} \quad (4)$$

where $Y_S = G_S + j B_S$ is the source admittance, at the measurement frequency; $C^T_n(W)$ is the correlation matrix in transmission (chain or ABCD) representation of the DUT with size W and $^\dagger$ is the Hermitian conjugate operation. Note that the following bolds.

1. The superscript symbol T used in (4) is adopted herein to solely refer to the transmission (ABCD) matrix representation.
2. The superscript symbol $^\dagger$ is adopted to indicate the following.
   1. The Hermitian conjugate operation on a matrix of complex elements.
   2. The transpose operation when applied to a matrix $M = M_{P \times Q}$ of real elements: $[M]^\dagger_{P \times Q} = [M]^T_{P \times Q}$.
   3. The complex conjugate operation on a complex number z (i.e., a 1×1 matrix $z = [Z]_{1 \times 1}$): $z^\dagger = z^*$.

The reason for generalizing the use of the superscript $^\dagger$ throughout this disclosure is to consolidate and streamline its notation and for the superscript $^T$ to solely identify the transmission matrix representation.

Refocusing attention on (4), it is clear that measuring the DUT's $T_e(W_m)$ at size $W_m$, with m=1, . . . ,M≥4, appears equivalent to changing the value of $Y_S$ in (4) by moving a source tuner M≥4 times and applying a least-squares method (LSM) approximation on the measured data to extract the four noise parameters.

The size-based procedure is not model-agnostic because it has been developed in conjunction with the Pospieszalski noise model, a very popular noise model based on two uncorrelated noise temperatures. Indeed, as there are four real noise parameter values in any 2×2 correlation matrix, a minimum of four different DUT sizes should support the full determination of its noise correlation matrix independently of the choice of model, making the tuner-less noise parameter determination approach applicable to any scalable, linear, active, or passive network.

Unfortunately, this logical and straightforward conclusion turns out to be incorrect as is explained herein. Instead, two new and unique results are presented:

1. to formally explain the limitation of the size-based procedure as to why attempting to use M≥4 different sizes of the same DUT will not yield the device's numerical four noise parameters;

2. to confirm that the size-based procedure that relies on the two temperature noise model for the scalable device is still sound in light of the conclusions of this article.

SUMMARY OF INVENTION

Therefore, described herein is a method to determine the 4 noise parameters (np) of a scalable linear device without using a tuner. Exemplary embodiments are of particular interest when active devices (transistors) are being tested, especially in a large pool of potential users.

The new method described in this disclosure overcomes the limit imposed by the conventional approach to allow the determination of all the 4 parameters in the out's correlation matrix. Conventional approaches detect the noise power generated by a device under test (out) at its output port. This disclosure describes a general method to determine the noise parameters of a scalable device by detecting the noise power from the out at both input and output ports. This method overcomes the limitations of conventional methods. Further, the method accounts for the noise power that an additional network positioned at the out's input port introduces. The additional network may not be scalable and is not critical: it can be a standard 3 (example: circulator) or 4 (example: directional coupler) port linear network (any network can work).

According to one aspect of the invention, a method to determine noise parameters of a scalable device, includes the determination of the noise parameters of the scalable device being independent of model adopted for the device.

Optionally, no additional external tuner is needed to determine the noise parameters of the scalable device.

Optionally, a circulator is not necessary to determine the noise parameters of the scalable device because a source of the device itself is used as a power detector.

Optionally, the scalable device is connected as part of a test circuit including a noise source, a recirculator, a first power detector and a second power detector.

Optionally, the first power detector is connected to the recirculator and between the noise source and the scalable device and the second detector is connected to the device under test.

Optionally, the scalable device generates noise powers $n_{n1}$, $b_{n2}$ outwards and the noise power bra is directed to the first power detector by the circulator for independent detection and the power $b_{n2}$ is directed to power detector 2.

Optionally, measurement is repeated changing a size of the scalable device.

The foregoing and other features of the invention are hereinafter described in greater detail with reference to the accompanying drawings.

DETAILED DESCRIPTION

A noisy linear two-port network can be described and analyzed in any representation of choice because they are equivalent in carrying the same information. However, some representations are more favorable than others when applied to particular cases or applications. For example, a scattering parameter representation is the standard choice for microwave DUT characterization; a transmission parameter representation, on the other hand, facilitates the analysis of cascaded networks.

The analysis herein will be developed in admittance parameter representation because of the direct proportionality of the Y parameters with size.

However, we are conscious that measurement equipment relies on scattering parameters, and for that reason, the characteristic impedance of the scattering parameter measurement system may also be considered in our discussion. Finally, as it is customary with microwave measurement systems, the characteristic impedance $Z_0=1/Y_0$ is assumed to be real.

Figure 1:
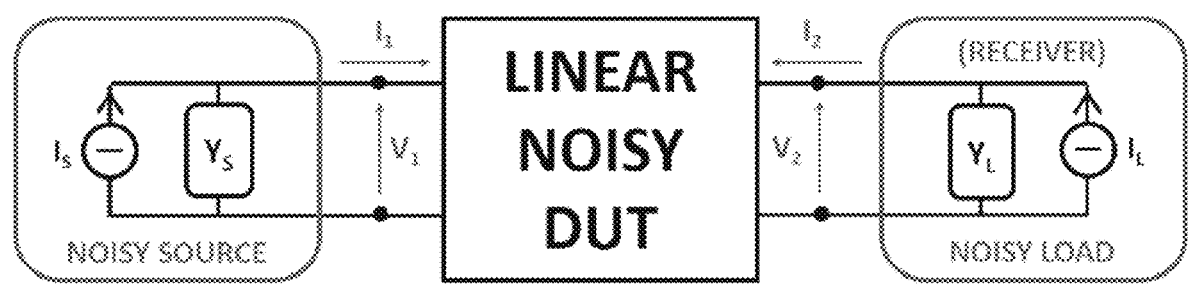
FIG. 1 is a fairly general representation of a noise measurement setup aiming at the experimental determination of the DUT's noise figure $F_m$ or its equivalent noise temperature $T_{e,m}$ at each size $W_m$. The noise measurement does not include the contribution of the load, which is accounted for during calibration and subtracted out of the noise quantity measured by the receiver. This analysis will consider a noiseless load (i.e., receiver) by setting the load's normalized equivalent noise temperature $t_L=0$ to obtain $I_L=0$.

FIG. 1 represents an idealized noise measurement setup consisting of a noisy source, a noisy scalable DUT, and a noisy receiver or load. The source $T_S$ and load $T_L$ temperatures are normalized to the standard $T_0=290K$ and equal to $t_S$ and $t_L$, respectively. M instances with a different size $W_m (m=1, \ldots, M)$ of the same noisy DUT are measured over frequency to determine its noise and signal performance— for example, scattering parameters and its equivalent noise temperature $T_{e,m}=T_e(W_m)$. Source, receiver, and DUT are, respectively, described by their Norton equivalent circuits and its admittance matrix Y at the angular frequency $\omega=2\pi f$ $$I_1=I_S-Y_S V_1 \tag{5a}$$

$$I=YV+I_n \tag{5b}$$

$$I_2=I_L-Y_L V_2 \tag{5c}$$

where $$\begin{cases} I = \begin{bmatrix} I_1 \\ I_2 \end{bmatrix}, & V = \begin{bmatrix} V_1 \\ V_2 \end{bmatrix} \\ Y = \begin{bmatrix} Y_{11} & Y_{12} \\ Y_{21} & Y_{22} \end{bmatrix}, & I_n = \begin{bmatrix} I_{n_1} \\ I_{n_2} \end{bmatrix} \\ Y_S = G_S + j B_S, & Y_L = G_L + j B_L \\ |I_S|^2 = 4N_0 T_S G_S, & |I_L|^2 = 4N_0 t_L G_L \\ t_s = \dfrac{T_s}{T_0}, & t_L = \dfrac{T_L}{T_0} \end{cases} \tag{6}$$

Furthermore, with reference to FIG. 1, the following standard assumptions are made.

1. The noise source is fully characterized, and its equivalent noise temperature $t_S=T_S/T_0$ is known.

2. The DUT's admittance matrix $Y=Y(W_m)$ in (5b) is known at each available size $W_m$ (m=1, . . . ,M).
3. The receiver is noiseless ($T_L=0 \leftrightarrow I_L=0$).

The goal of the measurement setup is to determine the DUT's correlation matrix $c^Y_n = C^Y_n/W$ normalized by size W and defined in (3).

FIG. 1 is a fairly general representation of a noise measurement setup aiming at the experimental determination of the DUT's noise figure $F_m$ or its equivalent noise temperature $T_{e,m}$ at each size $W_m$. The noise measurement does not include the contribution of the load, which is accounted for during calibration and subtracted out of the noise quantity measured by the receiver. This analysis will consider a noiseless load (i.e., receiver) by setting the load's normalized equivalent noise temperature $t_L=0$ to obtain $I_L=0$.

An admittance matrix representation may not be used in very limited cases—the canonical example is a series impedance. Other representations may be used to deal with those special cases of academic interest—for example, the scattering parameters—once the analysis of this article, whose primary interest focuses on two-port linear scalable devices, is understood. Additional passive networks may be present in a practical noise characterization setup, such as input tuner or output circulators. The noise contribution of these known networks can be easily accounted for and deembedded in our analysis to effectively obtain the setup of FIG. 1. Finally, neither the noisy source admittance Ys nor the noiseless load admittance $Y_L$ is assumed to perfectly matched to the corresponding system admittance $Y_0$ adopted by standard measurement equipment, such as vector network analyzers.

Herein is developed a procedure that allows the experimental determination of the four real-valued parameters of the correlation matrix $c^Y_n = C^Y_n/W$ normalized by size W with the measurement setup shown in FIG. 1. The procedure to be developed leverages the DUT's noise performance dependence on its size W.

The expression noise performance is used to allow for the many equivalent results that can be obtained from the measurement setup of FIG. 1 at each given size $W_m$: noise figure $F_m$, equivalent noise temperature $T_{e,m}$, and noise power $P_{n,m}$. However, the primary quantity that the receiver measures is the average noise power in a bandwidth B, and we will develop our analysis in terms of noise powers.

As FIG. 1 is a linear system whose source and DUT generate uncorrelated noise of each other, the power detected by the noiseless receiver is a superposition of the following:
1. power $P_{S \mapsto L}$ delivered by the noise source $I_S$ to the load $Y_L=1/Z_L$;
2. power $P_{D \mapsto L}$ delivered by the noisy network to the same load $Y_L$.

It will become clear in the next steps that developing the analysis in terms of the DUT's power contribution $P_{S \mapsto L}$ to the receiver is sufficient to formally explain the limitation of the size-based procedure in the determination of the DUT's four noise parameters.

The power $P_{S \mapsto L}$ detected by the receiver with the assumptions above is easily found by considering the power absorbed by load $Y_L$ when the DUT is the only active generator of noise power because the external noise sources $I_S$ and $I_L$ in (5a) and (5c) are $$P_{D \mapsto L} = \text{Re}\{V_2 I_2^\dagger\}\Big|_{\substack{I_S=0 \\ I_L=0}} = \frac{G_L}{|Y_L|^2} I_2 I_2^\dagger \quad (7)$$

which can be expanded with (5) to obtain $$P_{D \mapsto L} = \frac{G_L}{|Y_L|^2} U_{01}^\dagger Q I_n I_n^\dagger Q^\dagger U_{01} \quad (8)$$

where $$Q = Y_{SL}(Y + Y_{SL})^{-1} \quad (9a)$$

$$Y_{SL} = \begin{bmatrix} Y_S & 0 \\ 0 & Y_L \end{bmatrix} \quad (9b)$$

$$U_{01}^\dagger = [0 \ 1] \quad (9c)$$

$$I_n I_n^\dagger = i_n i_n^\dagger W. \quad (9d)$$

The correlation matrix $i_n i_n^\dagger$ in (9d) is equivalent to (3) and defines the unknown normalized noise parameters $c^Y_{n_{ij}}$ that are to be determined by measuring $P_{S \mapsto L}$ as a function of DUT's size W. The DUT's matrix Y is defined in (1) versus size W as well.

The next steps are as follows:
1. to expand (8) for each available DUT of size $W_m$ (m=1, . . . ,M);
2. to determine the DUT's noise parameters $c^Y_{n_{ij}}$ from the expansion of (8) through an LSM optimization.

The determination of the four real-valued noise parameters in Y representation defined as $$X = \begin{bmatrix} c^Y_{n_{11}} \\ \text{Re}\{c^Y_{n_{12}}\} \\ \text{Im}\{c^Y_{n_{12}}\} \\ c^Y_{n_{22}} \end{bmatrix} \quad (10)$$

would logically suggest that M=4 is the minimum number of distinct DUT sizes required for the solution of (8). Hence, the following holds.
1. Equation (8) is fully expanded as a linear combination of the unknown noise parameters (10).
2. Four coefficients, one for each noise parameter, are identified and collected.
3. For each coefficient defined in the previous step, the size parameter $W_m$ is identified and collected.

The outcome of this procedure is to rewrite (8) as $$P_{D \mapsto L} = \frac{G_L}{\Theta_m \Theta_m^\dagger} R_m^\dagger D_y X \quad (11)$$

where $$R_m = \begin{bmatrix} P_2(W_m) \\ P_2(W_m) \\ P_2(W_m) \\ P_2(W_m) \end{bmatrix} \quad (12a)$$

$$D_y(\omega) = \begin{bmatrix} \hat{y}_{11} & \emptyset & \emptyset & \emptyset \\ \emptyset & \hat{y}_{22} & \emptyset & \emptyset \\ \emptyset & \emptyset & \hat{y}_{33} & \emptyset \\ \emptyset & \emptyset & \emptyset & \hat{y}_{44} \end{bmatrix} \quad (12b)$$

-continued $$\hat{y}_{11}(\omega) = \begin{bmatrix} |y_{21}|^2 \\ 0 \\ 0 \end{bmatrix} \quad (12c)$$

$$\hat{y}_{22}(\omega) = \begin{bmatrix} -2\text{Re}\{y_{21}y_{11}^\dagger\} \\ -2\text{Re}\{y_{21}Y_S^\dagger\} \\ 0 \end{bmatrix} \quad (12d)$$

$$\hat{y}_{33}(\omega) = \begin{bmatrix} 2\text{Im}\{y_{21}y_{11}^\dagger\} \\ 2\text{Im}\{y_{21}Y_S^\dagger\} \\ 0 \end{bmatrix} \quad (12e)$$

$$\hat{y}_{44}(\omega) = \begin{bmatrix} |y_{11}|^2 \\ 2\text{Re}\{Y_S y_{11}^\dagger\} \\ |Y_S|^2 \end{bmatrix} \quad (12f)$$

the quantity $\emptyset$ in (12b) is a 3×1 vector of zeros; $P_2(W_m)$ is an instantiation of $$P_N(W) = \begin{bmatrix} W^N \\ W^{N-1} \\ \vdots \\ W^0 \end{bmatrix} \quad (13)$$

with N=2 at size $W_m$ $$\Theta_m = P_2^\dagger(W_n) \cdot \theta(Y_S, Y_L, \omega) \quad (14a)$$

$$\theta(Y_S, Y_L, \omega) = \begin{bmatrix} \Delta_y \\ Y_L y_{11} + Y_S y_{22} \\ Y_L Y_S \end{bmatrix} \quad (14b)$$

and $\Delta y$ is the determinant of the normalized admittance matrix (1). The denominator in (11) expresses the determinant of $(Y+Y_{SL})$ stemming from its inversion defined in (9a).

Note that the following holds.

1. Expression (12) shows how frequency and size interact by clearly separating frequency and size dependence in each term.
2. Only $\Theta_m$ in (12) depends on the load $Y_L$. As a consequence, it becomes intuitively understandable that the noise power (11) at constant frequency is a ratio of a quadratic polynomial $P_{N=2}(W)$ at numerator to its dyadic product $P_{N=2}P^\dagger_{N=2}$ at denominator, stemming from $\Theta_m \Theta^\dagger_m$ and mapping into a $P_{N=4}(W)$ vector—a fact that implies $\partial P_D \mapsto {}_L/\partial W$ to be zero for some W value at constant frequency.

Finally, all the quantities in (11) are comprised of real numbers and each factor carriers the proper dimension to accommodate for the various products: it would be straightforward to assume at this stage that measuring $P_D \mapsto {}_{L,m}$ for each available device with size $W_m$ (m=1, ... ,M≥4) will allow a least-squares fit to determine the noise parameters X from (11), but this is not the case, as described below.

A collection of power measurements $P_D \mapsto {}_{L,m}$ for m=1, ... ,M≥4 devices with distinct size $W_m$, generates an overdetermined system that can be solved with an LSM procedure $$\begin{bmatrix} R_1^\dagger \\ \vdots \\ R_M^\dagger \end{bmatrix} D_y X = \begin{bmatrix} \dfrac{|\Theta_1^\dagger|}{G_L} P_{D \to L,1} \\ \vdots \\ \dfrac{|\Theta_M|^2}{G_L} P_{D \to L,M} \end{bmatrix} \quad (15a)$$

$$\Updownarrow$$

$$AX = b \quad (15b)$$

from which $$X = (A^\dagger A)^{-1} A^\dagger b \quad (16)$$

is obtained. However, the noise parameters in X can be determined by (16) only if the square matrix $A^\dagger A$ is invertible—which implies that its determinant is not zero.

The A matrix is the product of two matrices, as shown in (15a).

1. $[D_y]_{12 \times 4}$ defined in (12b) is a 12×4 matrix that only depends on the angular frequency $\omega$ through the normalized admittance parameters $y_{ij}$ of the DUT and the source admittance $Y_S$. Hence, M measurements over size at the frequency of interest change neither size nor values of this matrix.
2. A matrix $[R^\dagger_m]_{M \times 12}$ with as many rows as the number M of measurements and 12 columns is shown by $$\begin{cases} [R_m^\dagger]_{M \times 12} = [P_2^\dagger(W_m) \ P_2^\dagger(W_m) \ P_2^\dagger(W_m) \ P_2^\dagger(W_m)] \\ [P_2^\dagger(W_m)]_{M \times 3} = \begin{bmatrix} W_1^2 & W_1 & 1 \\ W_2^2 & W_2 & 1 \\ \vdots & \vdots & \vdots \\ W_M^2 & W_M & 1 \end{bmatrix} \end{cases} \quad (17)$$

Hence, the matrix A in (15b) consists of M rows and four columns. It is now possible to examine the product $A^\dagger A$ in (16) in order to investigate its determinant The product $A^\dagger A$ can be expanded explicitly in the product of its terms [see (19)]. A singular value decomposition (SVD) procedure could be applied to each matrix in (19) to determine their respective rank. A closer look at $[R_m R^\dagger_m]_{12 \times 12}$ with the help of (17) reveals that it can be written as a set of 4×4 elements, each element being a 3×3 matrix E $$\begin{cases} [R_m R_m^\dagger]_{12 \times 12} = \begin{bmatrix} E & E & E & E \\ E & E & E & E \\ E & E & E & E \\ E & E & E & E \end{bmatrix} \\ [E]_{3 \times 3} = [P_2(W_m)]_{3 \times M} [P_2^\dagger(W_m)]_{M \times 3} \end{cases} \quad (18)$$

It appears evident that the rank of $[R_m R^\dagger_m]_{12 \times 12}$ is 3 because only one out of four columns of matrices $[E]_{3 \times 3}$ in (18) is clearly independent; and only first row of that column is independent—which makes the rank of $[R_m R^\dagger_m]_{12 \times 12}$ the same as the rank of $[E]_{3 \times 3}$. After expressing the matrix A, as shown in the following equation:

$$[A^\dagger]_{4 \times M} [A]_{M \times 4} = [D_y^\dagger]_{4 \times 12} [R_m]_{12 \times M} [R_m^\dagger]_{M \times 12} [D_y]_{12 \times 4} \quad (19a)$$

$$\Downarrow$$

-continued $$[A^\dagger A]_{4\times 4} = [D_y^\dagger]_{4\times 12}[R_m R_m^\dagger]_{12\times 12}[D_y]_{12\times 4}. \quad (19b)$$

It follows that the rank of (19b) is also 3, which implies that $A^\dagger A$, being a 4×4 matrix, is not invertible. In other words, against simple logic and intuition, the LSM determination of the four noise parameters through (16) will fail because $\det(A^\dagger A)=0$ even if M≥4 DUTs are characterized.

Before providing a numerical verification of the above-mentioned concepts by using recent published results obtained from the independent signal and noise characterization of active devices over frequency and size, some initial considerations on passive networks are presented, because the results above are applicable to either passive or active networks as long as they are scalable.

Regarding passive networks, the noise parameters of a passive scalable network can be calculated directly from its signal matrix. In admittance representation, the noise correlation matrix at temperature $t=T/T_0$ can be calculated as $$\frac{C_n^Y}{W} = c_n^Y \quad (20)$$
$$= 4N_0 t \frac{y+y^\dagger}{2}$$

which shows that the noise parameters in $C_n^Y$ are proportional to the size W because the admittance matrix Y is proportional to size as previously expressed in (1).

It is also interesting to note from (20) that reciprocal passive networks can be grouped into a set characterized by a real correlation coefficient $$\rho_n^Y = \frac{C_{n_{12}}^Y}{\sqrt{C_{n_{11}}^Y C_{n_{12}}^Y}} \quad (21)$$
$$= \frac{c_{n_{12}}^Y}{\sqrt{c_{n_{11}}^Y c_{n_{22}}^Y}}$$

because $\Im\{c_{n_{12}}^Y\}=0$. Hence, passive scalable two port reciprocal networks allow the determination of their noise parameters through (16) because their noise correlation matrix (20) is real with a total of three independent real elements.

Passive nonreciprocal networks are characterized by an asymmetrical matrix ($y_{12}\partial y_{21}$), which will cause (20) to yield a complex correlation coefficient. For example, a scalable circulator or a passive scalable network with controlled sources (similarly to the linear model of an active device) will have a complex correlation coefficient because the off-diagonal elements of its noise correlation matrix (20) are not the same.

It addition, it should also be pointed out that the correlation coefficient, (21) being either complex or real, also depends on the representation in use. For example, the same scalable DUT in FIG. 2 has a complex correlation coefficient in scattering parameter representation because $S_{12}=S_{21}$ is complex, and $$C_n^S = N_0 t(I-SS^\dagger) \quad (22)$$

will generate a complex $C_{n_{12}}^S$. Furthermore, $C_n^S$ would also be size-dependent unless the characteristic impedance in use was size-dependent as well—then, the bilinear transformation at the basis of the definition of $S_{ij}$ will be size-independent.

Figure 3:
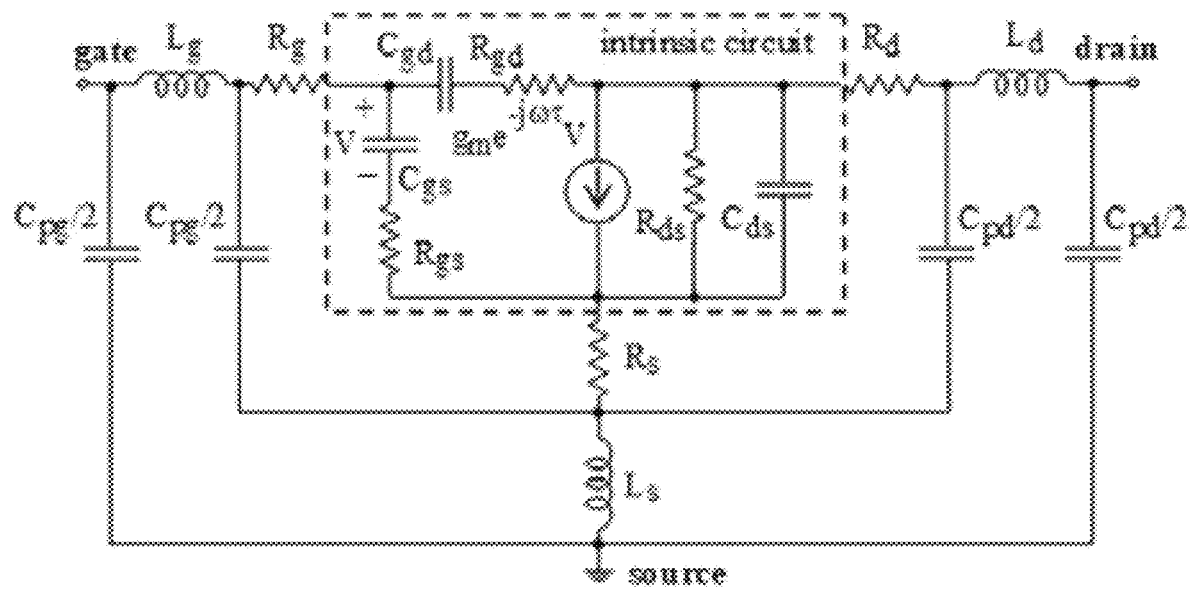
FIG. 3 shows a circuit generalization of the DUT measurement for verification purpose. (a) Extrinsic and intrinsic circuits; (b) DUT's extrinsic (network A) and intrinsic (network B) representation in a commercial simulator.
Figure 3:
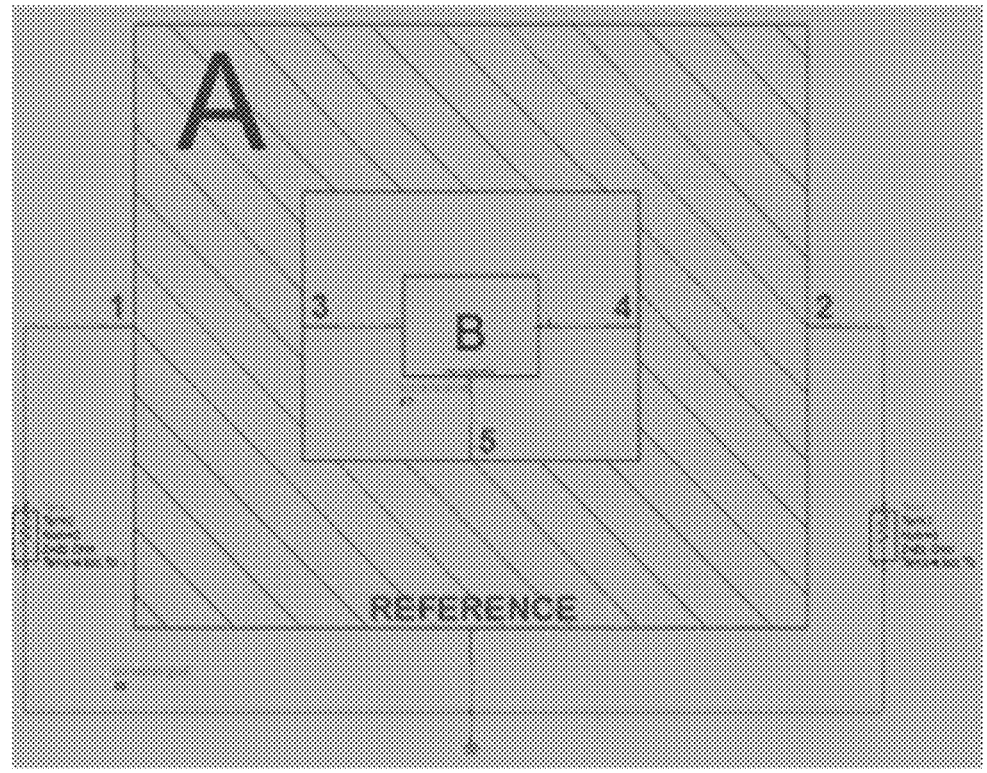

FIG. 3 shows the active DUT's equivalent circuit as the combination of a five-port network A [extrinsic circuit in FIG. 3(a)], embedding a three-port network B [intrinsic circuit in FIG. 3(a)]. The intrinsic model is based on the well-known two temperature noise models. FIG. 3(b) highlights the standard approach of considering the intrinsic circuit [network B in FIG. 3(b)] surrounded by parasitic components [network A in FIG. 3(b)]. The intrinsic circuit is the scalable network whose noise temperatures $T_{gs}$ and $T_{ds}$ must be extracted from measurement in order for the model to mimic the DUT's noise performance. It is customary to consider $T_{gd}=290$ K and expect $T_{gs}\approx 300$ K.

Figure 4:
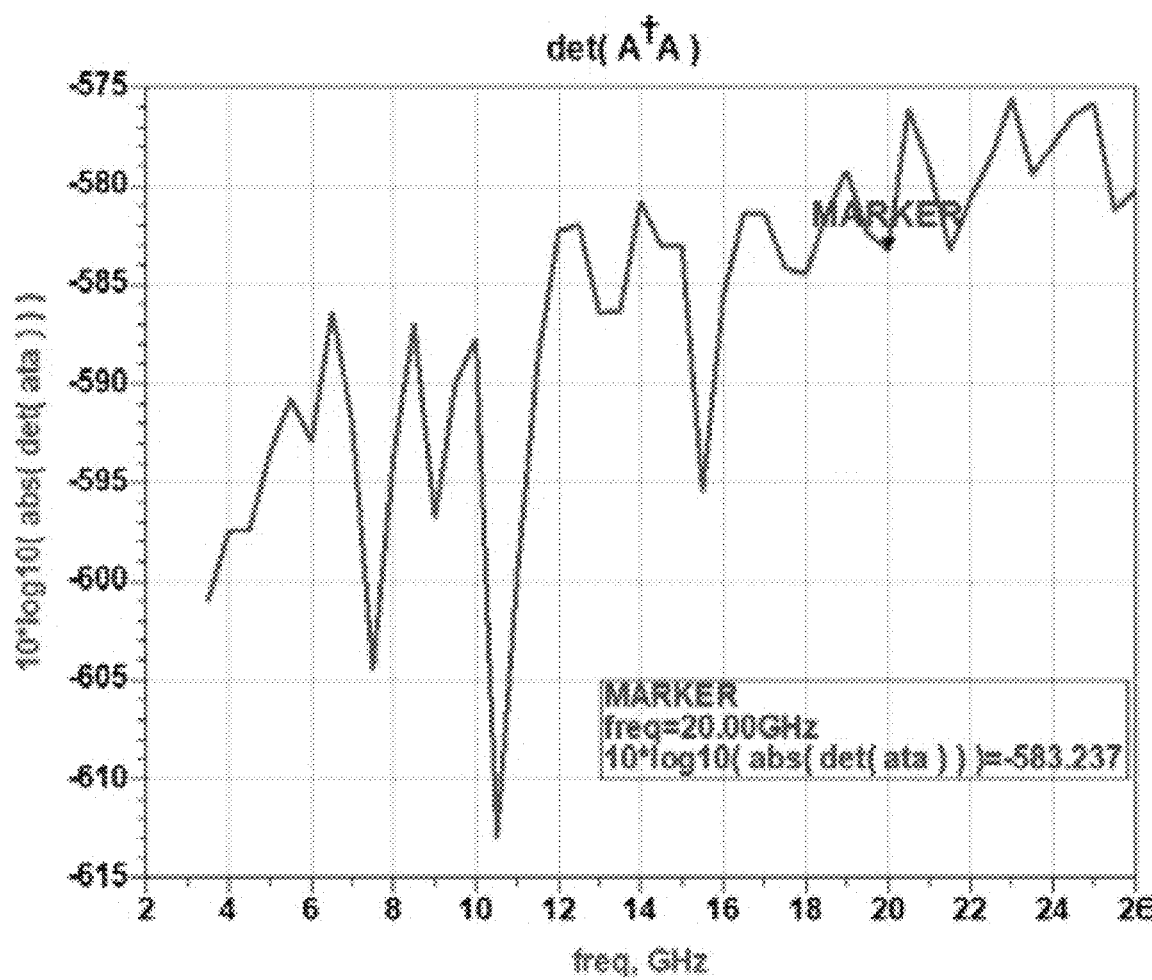
FIG. 4 shows a graph providing verification that det $(A^\dagger A)=0$ for the intrinsic circuit of FIG. 3.

To confirm the results of this analysis, attention is focused on the intrinsic circuit of FIG. 3 after de-embedding it from the extrinsic circuit, and the results are used to support a numerical example: the component values of the intrinsic circuit are collected in Table I, and the noise temperatures were found to be $T_{ds}=4958.101$K and $T_{gs}=328.255$K. The signal and noise performance of the intrinsic circuit over size W at 20 GHz is also reported in Table II. The values from both Table I and Table II allow the calculation outlined above and the verification that the matrix $(A^\dagger A)$ is not invertible: indeed, its determinant is also shown in Table II at 20 GHz and over frequency in FIG. 4, and it is equal to 0 within the numerical error of the simulator calculation.

TABLE I

Intrinsic Elements of the Scalable Model of FIG. 3

| Component | Value | Dimension |
|---|---|---|
| $g_m$ | 602.761 | (mS/mm) |
| $\tau$ | 1.006 | (ps) |
| $c_{gs}$ | 1.151 | (pF/mm) |
| $c_{ds}$ | 0.257 | (pF/mm) |
| $c_{gd}$ | 0.138 | (pF/mm) |
| $r_{gs}$ | 0.490 | ($\Omega \cdot$ mm) |
| $r_{ds}$ | 34.449 | ($\Omega \cdot$ mm) |
| $r_{gd}$ | 1.196 | ($\Omega \cdot$ mm) |

TABLE II

Real and Imaginary Values of the Admittance Matrix Elements and Corresponding Noise Temperature Measured at 20 GHz for the Intrinsic Circuit of FIG. 3. Calculation of $|\det(A^\dagger A)|$ Executed With MATLAB Based on Corresponding Y/W Normalized Values

| W (μm) | $Y_{11}$ (mS) | $Y_{12}$ (mS) | $Y_{21}$ (mS) | $Y_{22}$ (mS) | $T_{eq}/T_0$ (—) | $|\det(A^\dagger A)|$ (mS)$^4$ |
|---|---|---|---|---|---|---|
| 50 | 0.5283 + j 8.0641 | −0.0179 − j 0.8657 | 29.4621 − j 6.7331 | 1.4694 + j 2.4819 | 0.879 | 9.17 · 10$^{-32}$ |
| 100 | 1.0566 + j 16.1282 | −0.0359 − j 1.7318 | 58.9242 − j 13.5103 | 2.9387 + j 4.9637 | 0.587 | 2.96 · 10$^{-32}$ |

TABLE II-continued

Real and Imaginary Values of the Admittance Matrix Elements
and Corresponding Noise Temperature Measured at 20 GHz for the Intrinsic
Circuit of FIG. 3. Calculation of $|\det(A^\dagger A)|$ Executed With MATLAB Based on
Corresponding Y/W Normalized Values

| W (μm) | $Y_{11}$ (mS) | $Y_{12}$ (mS) | $Y_{21}$ (mS) | $Y_{22}$ (mS) | $T_{eq}/T_0$ (—) | $|\det(A^\dagger A)|$ (mS)$^4$ |
|---|---|---|---|---|---|---|
| 200 | 2.1132 + j 32.2565 | −0.0717 − j 3.4629 | 117.8484 − j 27.0206 | 5.8775 + j 9.9274 | 0.576 | 3.50 · 10$^{-33}$ |
| 300 | 3.1697 + j 48.3847 | −0.1076 j 5.1944 | 176.7726 − j 40.3308 | 8.8152 + j 14.8911 | 0.693 | 4.91 · 10$^{-32}$ |
| 400 | 4.2263 + j 64.5129 | −0.1434 − j 6.9259 | 235.6967 − j 54.0411 | 11.7550 + j 19.8349 | 0.841 | 1.55 · 10$^{-32}$ |
| 600 | 6.3395 + j 96.7693 | −0.2152 − j 10.3888 | 353.5450 − j 81.0617 | 17.6324 + j 29.7823 | 1.169 | 8.37 · 10$^{-32}$ |

The results above are general and applicable to any passive or active, scalable DUT independently of the representation. Stating that it is not possible to extract four real-valued noise parameters from measurements over size independently of the representation of choice in use is correct because any two representations V and K are connected by a matrix transformation of the type $$C_n^K = C_{V \to K} C_n^V C_{V \to K}^\dagger \qquad (23)$$

where $C_{V \to K}$ is a matrix that transform the noise correlation matrix $C_n^V$ in V representation to the noise correlation matrix $C_n^K$ in K representation, and it only depends on the elements of the signal matrix in V representation. Therefore, if the extraction over size fails in one representation, it will fail in any other representation. This is not to say that (16) may not be applicable in particular cases.

Figure 2:
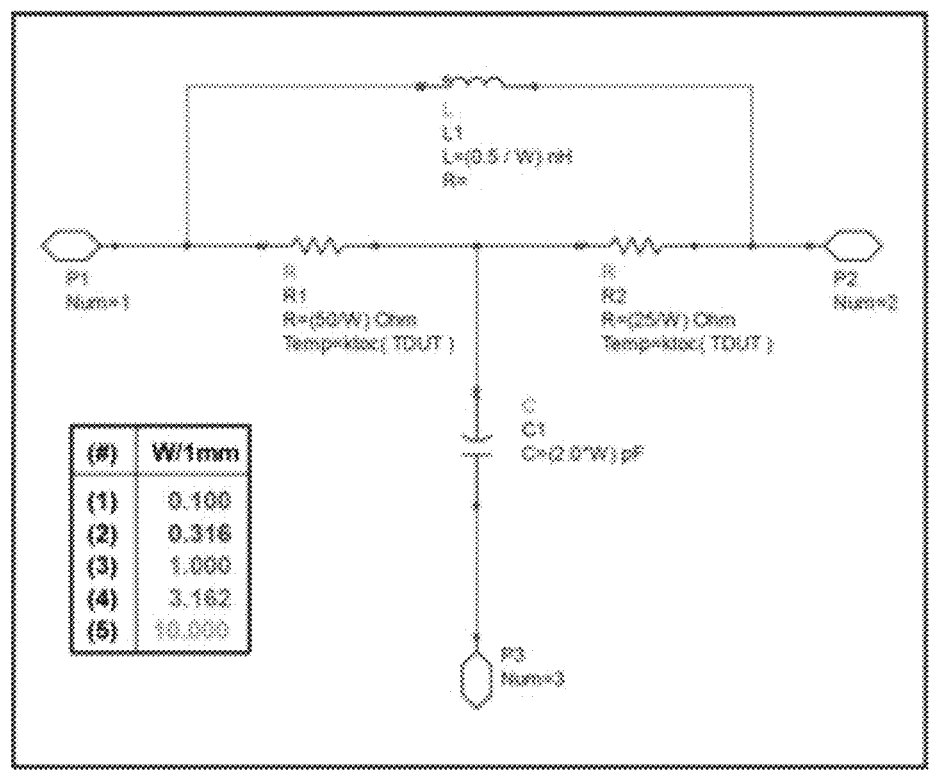
FIG. 2 shows simulation results of a scalable passive network. The table in (a) corresponds to five arbitrary sizes selected with the sole purpose of implementing DUT scalability. (a) Passive, scalable DUT schematic used as verification example. (b) Noise parameters in normalized admittance Y (top row) and scattering S (bottom row) representations.
Figure 2:
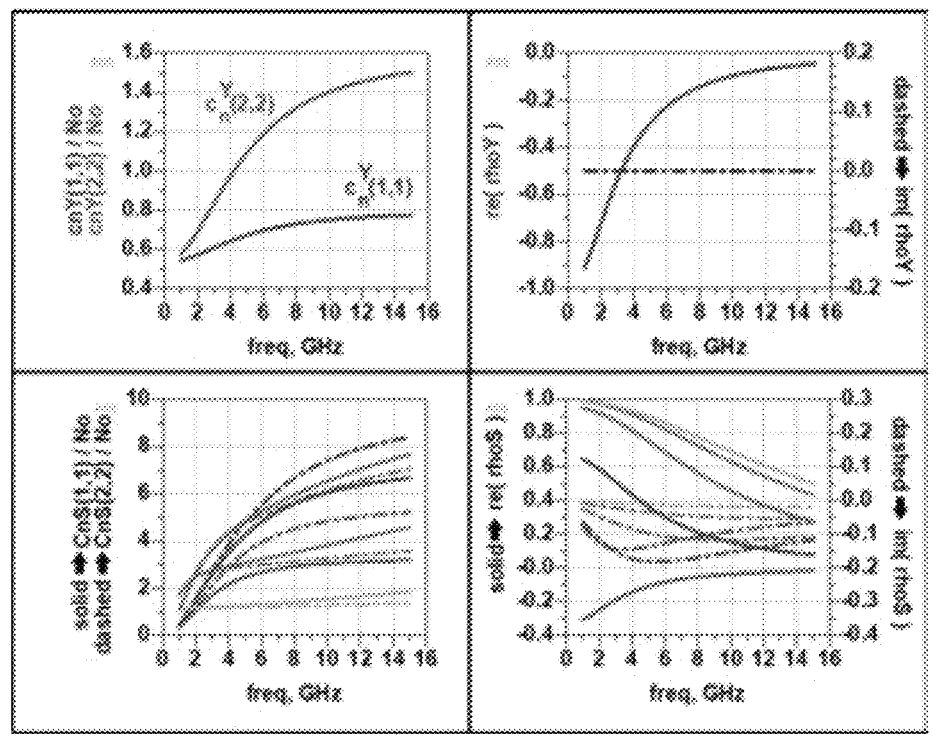

It has been pointed out earlier that a passive, reciprocal network will generate a real correlation coefficient based on (20). If the network is also scalable, then the analysis of this article can be tailored to account for $\Im m\{c_{n12}^Y\} = 0$ by appropriately reducing the size of A. This reduction in size affects only the matrix $D_y$ (12b), not the matrix $R_m$ (12a) that contains size information only. As a consequence, the number of unknowns decreases from four to three, and (16) can support the extraction of the three remaining real-valued noise parameters. It is easy to set this case up in a circuit simulator and verify this conclusion. Deceivingly, if our analysis had been conducted in the scattering parameter domain, (22) would not easily lead to matrix size reduction as easily as in the $c_n^Y$ case because its off-diagonal elements are complex and nonzero, as shown in FIG. 2.

It is also noticeable from the procedure outlined to obtain (11) that the noise power $P_D \mapsto_L$ absorbed by the load depends on the load $Y_L$. Indeed, we have made no statement when determining $P_D \mapsto_L$—for example, we have not claimed that $P_D \mapsto_L$ is defined as the available power; to the contrary, a generic $Y_L$ is loading the DUT's output port, as shown in FIG. 1. On the other hand, it is a well-known fact that the noise performance of a device in terms of noise figure or equivalent noise temperature is not dependent on the load because of the selection of the load as the conjugate value of the output impedance value. As a consequence, the noise power $P_S \mapsto_L$ delivered by the source to the load through the DUT will have the same $G_L/|\Theta_m|^2$ dependence shown by $P_D \mapsto_L$ in (11) in order to guarantee that the ratio $P_D \mapsto_L / P_S \mapsto_L$ at the basis of the definition of noise figure or equivalent noise temperature is independent of the load, independently of the choice of $Y_L$ value.

The LSM procedure (16) for the determination of X obtains $P_D \mapsto_{L,m}$ from the measurement of the DUT's noise figure $F_m$ and the determination of $P_S \mapsto_{L,m}$ at size $W_m$. This latter quantity, $P_S \mapsto_{L,m}$, will be the product of the following:

1. a load termination term $G_L/|\Theta_m|^2$ that depends on the terminations $Y_S$ and $Y_L$, size $W_m$, and frequency because of (14);
2. a term $Y_m(W_m y)$ dependent on the DUT's size $W_m$ and its normalized admittance matrix y;
3. the noise source $|I_S|^2$.

Hence $$P_{S \to L,m} = \frac{G_L}{|\Theta_m|^2} Y_m(W_m, y)|I_S|^2 \qquad (24)$$

and the load termination term cancels out with the corresponding term of (15) to yield $$(F_m-1) \; Y_m|I_S|^2 = R_m^\dagger D_y X. \qquad (25)$$

The noise figure measurement allows (25) to be employed and the dependence on the load termination completely removed. However, the considerations on the inversion of $A^\dagger A$ still apply because $A = R_m^\dagger D_y$ in (25) as well as (15) in terms of power $P_D \mapsto_L$.

The results described herein fits with the experimental determination of the noise parameters versus size demonstrated and discussed by those skilled in the art. The reason lays in two facts described by the following statements.

1. The DUT's intrinsic (noise) model in use, shown in FIG. 3(a), is based on and relies on two uncorrelated noise sources represented in transmission (chain or ABCD) representation by $T_{gs}$ and $T_{ds}$ associated with the input and output resistors.
2. The topology of the model is known.

It is, therefore, possible based on statement 1 to obtain the correlation matrix in admittance representation starting from the hybrid representation, whereas the off-diagonal element in the correlation matrix $C_n^H$ is zero. Furthermore, statement 2 allows expressing the hybrid matrix H in terms of its components that constitute the scalable intrinsic model. The final result stemming from applying (23) is $$c_n^Y = \frac{4N_0}{|H_{11}|^2} \begin{bmatrix} t_{gs} \frac{r_{gs}}{W^2} & t_{gs} \frac{r_{gs}}{W^2} H_{21}^\dagger \\ t_{gs} \frac{r_{gs}}{W^2} H_{21} & \left\{ t_{gs} \frac{r_{gs}}{W^2} |H_{21}|^2 + t_{ds} g_{ds} |H_{11}|^2 \right\} \end{bmatrix} \qquad (26)$$

where $$\begin{cases} H_{11} \propto \dfrac{1}{W}; & \dfrac{\partial H_{21}}{\partial W} = 0 \\ r_{gs} = R_{gs}W; & t_{gs} = \dfrac{T_{gs}}{T_0} \\ g_{ds} = \dfrac{G_{ds}}{W}; & t_{ds} = \dfrac{T_{ds}}{T_0} \end{cases} \quad (27)$$

and the dependence of the H parameters of interest on the size W is also indicated in (27). If (26) is used in the analysis above, the unknown vector X (10) will consist of two elements, $t_{gs}$ and $t_{ds}$, and an LSM solution (16) can be obtained as demonstrated in prior publications because the dimensions of the matrix $D_y$ (12b) will be reduced to a 12×2 dimension.

Figure 5:
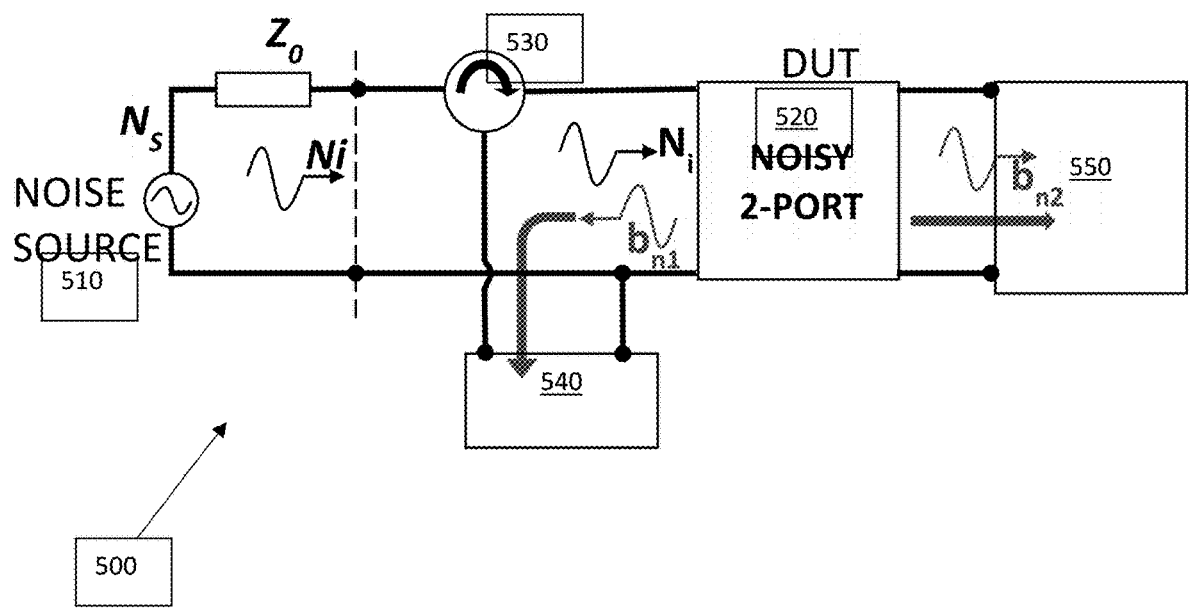
FIG. 5 shows an exemplary test circuit.

Turning now to FIG. 5, shown is an exemplary test circuit 500 including a noise source 510, a device under test 520, a recirculator 530, a first power detector 540 and a second power detector 550. The first power detector is connected to the recirculator and between the noise source and the device under test. The second detector is connected to the device under test in a conventional manner. The device under test 520 generates noise powers $b_{n1}$, $b_{n2}$ outwards. The DUT's 520 noise power $b_{n1}$ is directed to power detector 1 by the circulator for independent detection. The power $b_{n2}$ is directed to power detector 2 as in standard setup for independent detection. Measurement is repeated changing DUT size. The setup allows the direct measurement of both noise powers $b_{n1}$ and $b_{n2}$ at the same time.

This setup solves a system of two equations:

$$F_{Source\ toPower\ Dectector\ 1} = 1 + \frac{y_S^+(W \cdot C_{dev})y_S}{4N_i G_S} \quad (28)$$

$$F_{Source\ to\ Power\ Dectector\ 2} = 1 + \frac{y_S^+(W \cdot C_{dev})y_S}{4N_i G_S}$$

This setup has been demonstrated in a system simulator to determine the $F_{S \to PD1}$ and $F_{S \to PD2}$ values for each size W, the de-embedding (elimination) of the noise contribution of the circulator, and the solution of the equations for the correlation matrix $C_{dev}$ elements.

This disclosure has discussed the basis for the characterization of the noise performance of a scalable linear network as a function of size, and it has proved that it is not possible to extract the four noise parameters of a scalable network as a general procedure. A practical example is offered with data obtained from a measurement of a set of active devices. Nevertheless, this disclosure has also discussed particular cases that support the determination of the elements of the noise correlation matrix versus size and explained the reasons why prior work is valid. In particular, the determination of the equivalent noise temperatures $T_{gs}$ and $T_{ds}$ at the basis of a widely used noise model is confirmed when a number of different size DUTs are available.

A novel solution to overcome the limitations to the determination of the noise parameters discussed earlier has been devised and described. The solution requires only standard measurement equipment and commercially available hardware. Simulations have been executed to confirm that a model-agnostic approach to the determination of the four real-valued noise parameters of a scalable two-port device is indeed achievable. The new approach has valuable applications of great interest in the semiconductor arena because it allows the noise characterization of any active device to be automated over frequency, bias, and temperature.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for determining noise parameters of a scalable device, wherein the determination of the noise parameters of the scalable device is independent of model adopted for the device, the method comprising:
    taking a measurement, wherein taking the measurement comprises:
        detecting, using a first power detector, a first noise power, wherein the first noise power is generated by a device under test (DUT) and is directed, by a recirculator, to the first power detector, and
        detecting, using a second power detector, a second noise power, wherein the second noise power is generated by the DUT and is directed, by the DUT, to the second power detector;
    changing a size of the DUT and repeating the measurement; and
    determining the noise parameters based on the first noise power, the second noise power, wherein the noise parameters include a noise figure from the noise source to the first power detector, and wherein determining the noise parameters comprises determining the noise figure based on a correlation matrix of noise parameters for the DUT.

2. The method of claim 1, wherein the noise figure is a first noise figure $F_{S \to PD1}$, and wherein determining the noise parameters comprises:
    determining the first noise figure $F_{S \to PD1}$ from a noise source, coupled to the recirculator, to the first power detector; and
    determining a second noise figure $F_{S \to PD2}$ from the noise source to the second power detector.

3. The method of claim 2, further comprising simultaneously determining $F_{S \to PD1}$ and $F_{S \to PD2}$.

4. The method of claim 2, further comprising determining $F_{S \to PD1}$ based on the equation:

$$F_{S \to PD1}(W) = 1 + \frac{y_S^+(W \cdot C_{dev})y_S}{4N_i G_S}.$$

5. The method of claim 4, further comprising determining $F_{S \to PD2}$ based on the equation:

$$F_{S \to PD2}(W) = 1 + \frac{y_S^+(W \cdot C_{dev})y_S}{4N_iG_S}.$$

6. The method of claim 5, wherein $C_{dev}$ is the correlation matrix of 4 noise parameters, wherein $y_s$ represents source admittance of the noise source, wherein + represents a Hermitian conjugate matrix operation, and wherein $N_i$ represents the first noise power.

7. The method of claim 1, wherein determining the noise parameters comprises determining 4 noise parameters.

8. The method of claim 1, wherein the scalable device is configured to measure noise parameters for DUTs of different sizes W, and wherein the correlation matrix is a function of sizes W.

9. The method of claim 8, wherein the noise figure is a function of sizes W.

10. A device for detecting noise parameters, the device comprising:
   a noise source;
   a recirculator coupled to the noise source;
   a device under test (DUT) coupled to the recirculator, wherein the DUT is configured to generate a first noise power and a second noise power, wherein the DUT is configured to be replaceable;
   a first power detector coupled to the recirculator and further coupled between the noise source and the DUT, wherein the recirculator is configured to direct the first noise power to the first power detector; and
   a second power detector coupled to the DUT, wherein the DUT is configured to direct the second noise power to the second power detector, wherein the device is configured to determine a noise figure from the noise source to the first power detector based on a correlation matrix of noise parameters for the DUT.

11. The device of claim 10, wherein the noise figure is a first noise figure $F_{S \to PD1}$, and wherein the device is further configured to determine a second noise figure $F_{S \to PD2}$ from the noise source to the second power detector.

12. The device of claim 11, wherein the device is configured to simultaneously determine $F_{D \to PD1}$ and $F_{S \to PD2}$.

13. The device of claim 11, wherein the device is configured to determine $F_{S \to PD1}$ based on the equation:

$$F_{S \to PD1}(W) = 1 + \frac{y_S^+(W \cdot C_{dev})y_S}{4N_iG_S}.$$

14. The device of claim 13, wherein the device is configured to determine $F_{S \to PD2}$ based on the equation:

$$F_{S \to PD2}(W) = 1 + \frac{y_S^+(W \cdot C_{dev})y_S}{4N_iG_S}.$$

15. The device of claim 14, wherein $C_{dev}$ is the correlation matrix of 4 noise parameters, wherein $y_s$ represents source admittance of the noise source, wherein + represents a Hermitian conjugate matrix operation, and wherein $N_i$ represents the first noise power.

16. The device of claim 10, wherein the device is configured to determine 4 noise parameters of the DUT based on the first noise power and the second noise power.

17. The device of claim 10, wherein the device is configured to measure noise parameters for DUTs of different sizes W, and wherein the correlation matrix is a function of sizes W.

18. The device of claim 17, wherein the noise figure is a function of sizes W.

* * * * *